United States Patent
Fukushima

(10) Patent No.: US 11,285,813 B2
(45) Date of Patent: Mar. 29, 2022

(54) ESTIMATION DEVICE FOR ESTIMATING AN SOC OF AN ENERGY STORAGE DEVICE, ENERGY STORAGE APPARATUS INCLUDING ESTIMATION DEVICE FOR ESTIMATING AN SOC OF AN ENERGY STORAGE DEVICE, AND ESTIMATION METHOD FOR ESTIMATING AN SOC OF AN ENERGY STORAGE DEVICE

(71) Applicant: GS Yuasa International Ltd., Kyoto (JP)

(72) Inventor: Atsushi Fukushima, Kyoto (JP)

(73) Assignee: GS YUASA INTERNATIONAL LTD., Kyoto (JP)

( * ) Notice: Subject to any disclaimer, the term of this patent is extended or adjusted under 35 U.S.C. 154(b) by 277 days.

(21) Appl. No.: 16/496,900

(22) PCT Filed: Mar. 28, 2018

(86) PCT No.: PCT/JP2018/012798
§ 371 (c)(1),
(2) Date: Sep. 23, 2019

(87) PCT Pub. No.: WO2018/181489
PCT Pub. Date: Oct. 4, 2018

(65) Prior Publication Data
US 2020/0094707 A1    Mar. 26, 2020

(30) Foreign Application Priority Data

Mar. 28, 2017  (JP) .............................. JP2017-062703

(51) Int. Cl.
*G01R 31/3828*  (2019.01)
*B60L 3/00*  (2019.01)
(Continued)

(52) U.S. Cl.
CPC .................. *B60L 3/00* (2013.01); *B60L 58/13* (2019.02); *G01R 31/3828* (2019.01); *H01M 10/44* (2013.01)

(58) Field of Classification Search
CPC . G01R 31/382; G01R 31/3828; H01M 10/44; H01M 10/88; B60L 3/00; B60L 58/13
(Continued)

(56) References Cited

U.S. PATENT DOCUMENTS

2008/0091364 A1   4/2008  Lim et al.
2012/0056591 A1   3/2012  Abe et al.
(Continued)

FOREIGN PATENT DOCUMENTS

JP    H11-122839 A     4/1999
JP    2000-295775 A    10/2000
(Continued)

OTHER PUBLICATIONS

English machine translation of JP2000295775 performed on Aug. 26, 2021, 28 pages (Year: 2021).*
(Continued)

*Primary Examiner* — Nathaniel R Pelton
(74) *Attorney, Agent, or Firm* — McGinn I.P. Law Group, PLLC.

(57) ABSTRACT

An estimation device that estimates the SOC of an energy storage device includes a current measurement unit, an estimation unit, and a change unit, in which the estimation unit executes an estimation process for estimating the SOC of the energy storage device by integrating a current measured by the current measurement unit, and a correction process for charging, when a predetermined correction condition is reached, the energy storage device to full charge or the vicinity thereof, and correcting an error in the estimated
(Continued)

SOC value, and the change unit changes the correction condition according to a state of the energy storage device.

7 Claims, 9 Drawing Sheets

(51) Int. Cl.
*H01M 10/44* (2006.01)
*B60L 58/13* (2019.01)
(58) Field of Classification Search
USPC .......................................................... 320/104
See application file for complete search history.

(56) References Cited

U.S. PATENT DOCUMENTS

| 2012/0065824 A1* | 3/2012 | Takahashi | H02J 7/0021 |
| | | | 701/22 |
| 2012/0293121 A1* | 11/2012 | Horii | G01R 31/382 |
| | | | 320/109 |
| 2014/0079969 A1 | 3/2014 | Greening et al. | |
| 2016/0259010 A1* | 9/2016 | Syouda | G01R 31/374 |
| 2017/0045587 A1 | 2/2017 | Kim et al. | |

FOREIGN PATENT DOCUMENTS

| JP | 2004-222433 A | 8/2004 |
| JP | 2005-164604 A | 6/2005 |
| JP | 2005-261151 A | 9/2005 |
| JP | 2008-099541 A | 4/2008 |
| JP | 4772137 B2 | 9/2011 |
| JP | 2012-244648 A | 12/2012 |
| JP | 2017-022852 A | 1/2017 |
| WO | WO 2010/150667 A1 | 12/2010 |

OTHER PUBLICATIONS

English machine translation of JP2005261151 performed on Aug. 26, 2021, 21 pages (Year: 2021).*
International Search Report (ISR) (PCT Form PCT/ISA/210), in PCT/JP2018/012798, dated Jun. 5, 2018.

* cited by examiner

ESTIMATION DEVICE FOR ESTIMATING AN SOC OF AN ENERGY STORAGE DEVICE, ENERGY STORAGE APPARATUS INCLUDING ESTIMATION DEVICE FOR ESTIMATING AN SOC OF AN ENERGY STORAGE DEVICE, AND ESTIMATION METHOD FOR ESTIMATING AN SOC OF AN ENERGY STORAGE DEVICE

TECHNICAL FIELD

The present invention relates to a technique for correcting an error in an estimated SOC value as determined by a current integration method.

BACKGROUND ART

One method for estimating the SOC of an energy storage device is a current integration method. In the current integration method, an error in the estimated SOC value due to a current measurement error is accumulated by the current measurement unit. Therefore, it is conceivable to detect the SOC by another method and periodically correct the error in the estimated SOC value. As a document disclosing a technique for correcting an estimated SOC value by a current integration method, there is Patent Document 1 described below.

PRIOR ART DOCUMENT

Patent Document

Patent Document 1: Japanese Patent No. 4772137

SUMMARY OF THE INVENTION

Problems to be Solved by the Invention

One of the methods for correcting the error in the estimated SOC value as determined by the current integration method is a method of correcting by charging the energy storage device to full charge or the vicinity thereof. Depending on the usage and state of the energy storage device, it may be preferable that the frequency of charging until full charge is small.

An object of the present invention is to make the execution frequency of a correction process and charge control into a suitable frequency according to the state of an energy storage device.

Means for Solving the Problems

An estimation device for estimating an SOC of an energy storage device includes a current measurement unit, an estimation unit, and a change unit, in which the estimation unit executes an estimation process for estimating the SOC of the energy storage device by integrating a current measured by the current measurement unit and a correction process for charging, when a predetermined correction condition is reached, the energy storage device to full charge or the vicinity thereof and correcting an error in the estimated SOC value, and the change unit changes the correction condition according to a state of the energy storage device.

Advantages of the Invention

According to this configuration, the execution frequency of the correction process and the charge control can be made into a suitable frequency according to the state of the energy storage device.

MODE FOR CARRYING OUT THE INVENTION

Figure 1:
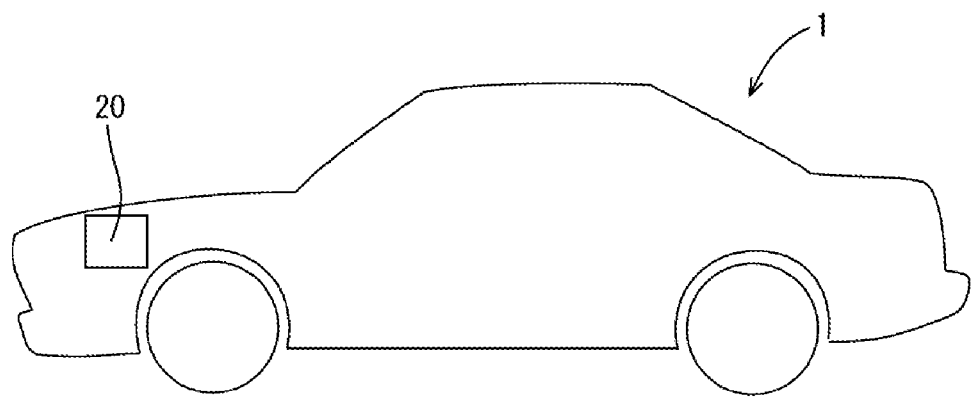
FIG. 1 is a side view of an automobile.

First, an outline of an estimation device will be described.
An estimation device for estimating an SOC of an energy storage device includes a current measurement unit, an estimation unit, and a change unit, in which the estimation unit executes an estimation process for estimating the SOC of the energy storage device by integrating a current measured by the current measurement unit and a correction process for charging, when a predetermined correction condition is reached, the energy storage device to full charge or the vicinity thereof and correcting an error in the estimated SOC value, and the change unit changes the correction condition according to a state of the energy storage device.

In this configuration, when a predetermined correction condition is reached, a correction process is executed to correct an error in the estimated SOC value. In addition, the correction condition is changed according to the state of the energy storage device. Therefore, the execution frequency of the correction process and the charge control can be made into a frequency suitable for the state of the energy storage device.

The change unit may change a charge condition for charging the energy storage device in the correction process according to a state of the energy storage device. In this configuration, the charge condition at the time of correction can be set to a condition suitable for the state of the energy storage device.

The difference in the state of the energy storage device may be a difference in required SOC estimation accuracy. In this configuration, the correction condition is changed according to the required SOC estimation accuracy. Therefore, the execution frequency of the correction process and the charge control can be made into a frequency suitable for the required SOC estimation accuracy. Similarly, the charge condition may be changed.

The required level of the SOC estimation accuracy may vary depending on the environmental temperature or the capacity retention ratio of the energy storage device. In this configuration, the correction condition is changed according to the environmental temperature and the capacity retention ratio of the energy storage device. For example, during summer, when the internal resistance of the energy storage device is low and the power is high (required SOC estimation accuracy is "low"), the number of charge control can be reduced by relaxing the correction condition and reducing the execution frequency of the correction process. On the other hand, during winter, when the internal resistance of the energy storage device is high and the power is low (required SOC estimation accuracy is "high"), the SOC estimation accuracy and battery performance can be maintained by tightening the correction condition and increasing the execution frequency of the correction process. When the capacity retention ratio of the energy storage device is high, the internal resistance is low, and when the capacity retention ratio is low, the internal resistance is high. Therefore, the required level of SOC estimation accuracy may be the same as in the summer/winter described above.

An execution unit may be provided that executes a process of shifting the use range of the energy storage device to the high SOC side when the difference between the condition value defined as the correction condition and the threshold is less than a predetermined value.

In this configuration, when a condition value defined as a correction condition, such as a cumulative estimation error of SOC or an energization time of the energy storage device, is less than a predetermined value with respect to the threshold, the use range of the energy storage device is shifted to the high SOC side. By doing so, the SOC value before the start of charging becomes high, and therefore the time (charging time) for charging the energy storage device to full charge or the vicinity thereof for the correction process can be shortened.

The above estimation device may be applied to an energy storage apparatus mounted on a vehicle. This configuration is effective for improving the fuel consumption of the vehicle. For example, when the required SOC estimation accuracy is low, the fuel consumption of the vehicle can be improved by relaxing the correction condition and adjusting so as to reduce the execution frequency of the correction process and the charge control.

The estimation device can be applied to an energy storage apparatus having an energy storage device.

As an estimation method, the SOC of the energy storage device is estimated by current integration, and when the predetermined correction condition is reached, the energy storage device is charged to full charge or the vicinity thereof, the error in the estimated SOC value is corrected, and the correction condition is changed according to the state of the energy storage device.

Embodiment 1

1. Description of Battery

Figure 2:
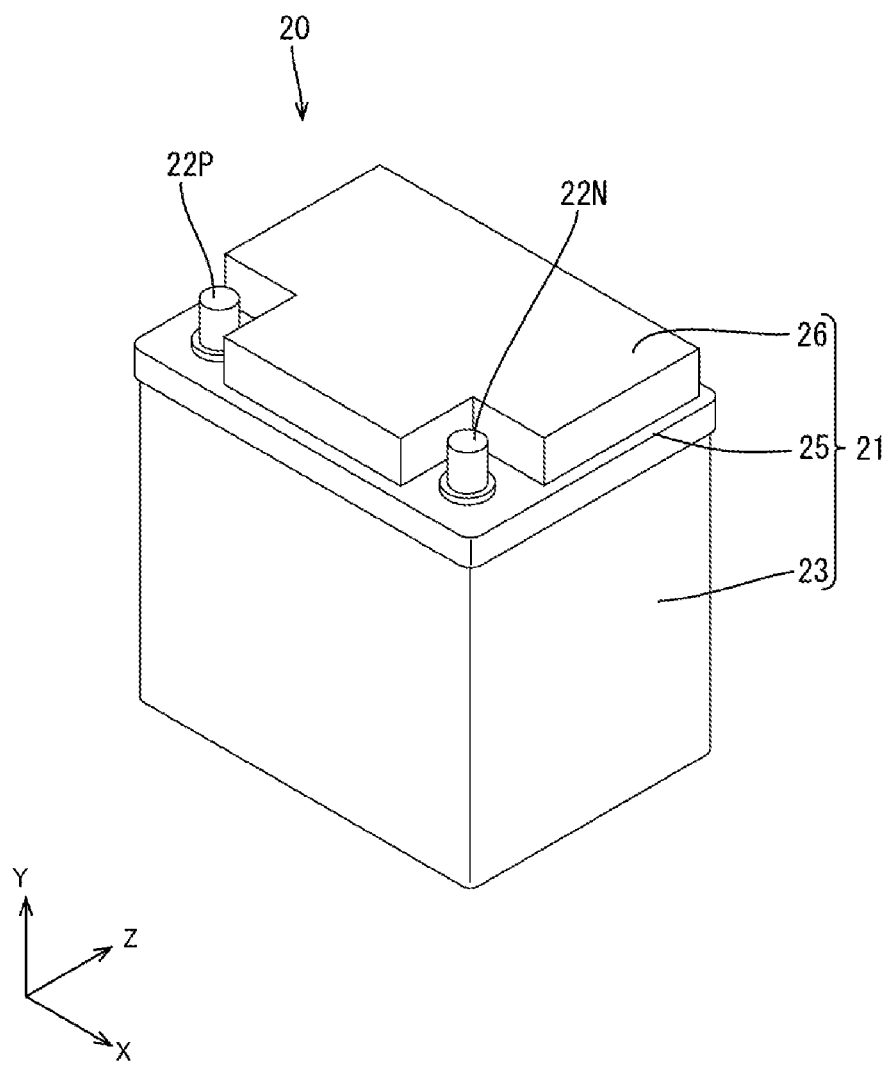
FIG. 2 is a perspective view of a battery.
Figure 3:
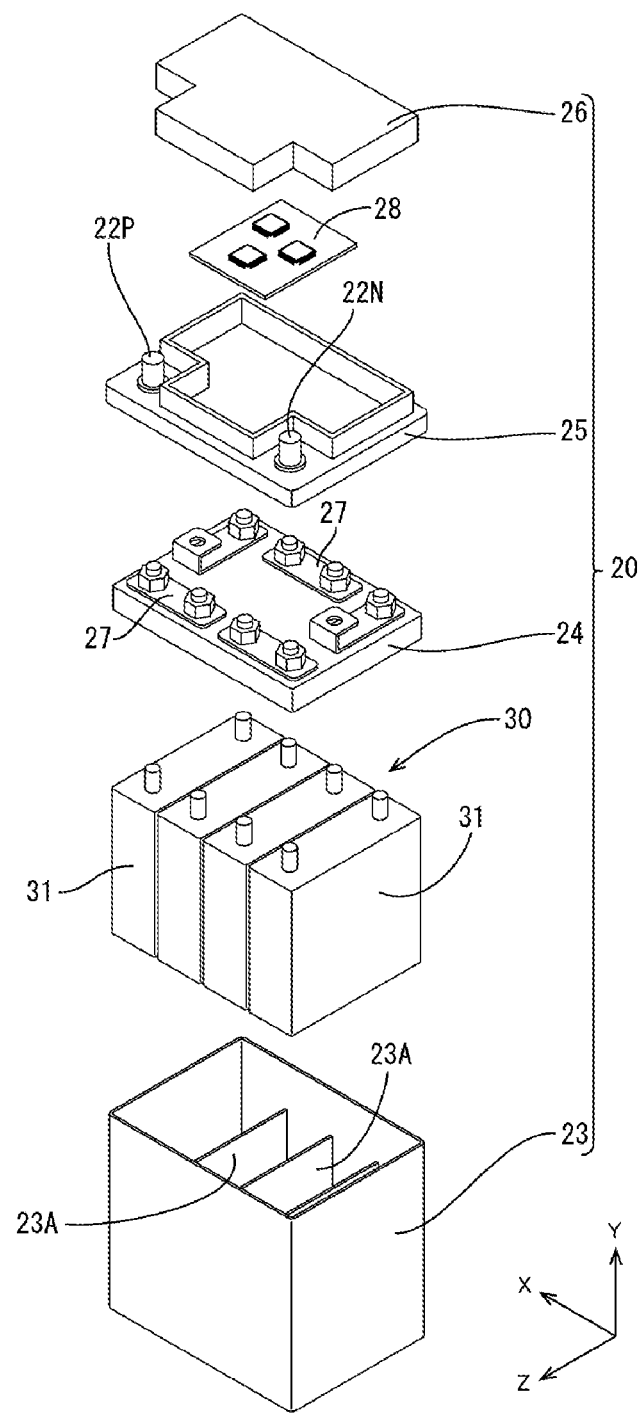
FIG. 3 is an exploded perspective view of the battery.
Figure 4:
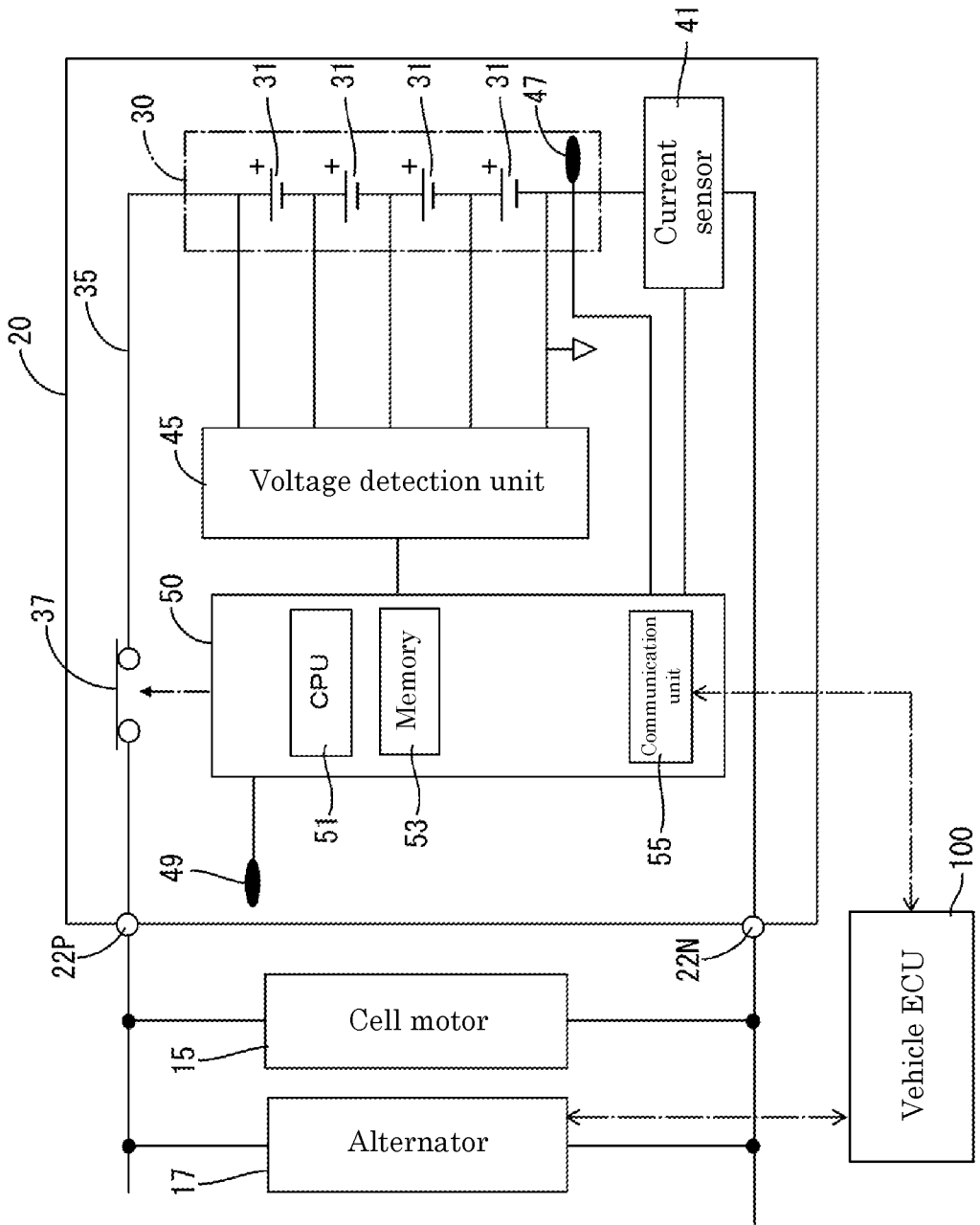
FIG. 4 is a block diagram showing an electrical configuration of the battery.

FIG. 1 is a side view of an automobile, FIG. 2 is a perspective view of a battery, FIG. 3 is an exploded perspective view of the battery, and FIG. 4 is a block diagram showing an electrical configuration of the battery.

An automobile (an example of a vehicle) 1 includes a battery (an example of an energy storage apparatus) 20 as shown in FIG. 1. As shown in FIG. 2, the battery 20 has a block-shaped battery case 21, and the battery case 21 houses an assembled battery 30 including a plurality of secondary batteries 31 and a control board 28. In the following description, when referring to FIG. 2 and FIG. 3, the description will be provided with the vertical direction of the battery case 21 as the Y direction, a direction along the long side direction of the battery case 21 as the X direction, and the depth direction of the battery case 21 as the Z direction assuming that the battery case 21 is placed horizontally without being inclined with respect to the installation surface.

As shown in FIG. 3, the battery case 21 includes a box-shaped case main body 23 that opens upward, a positioning member 24 that positions the plurality of secondary batteries 31, an inner lid 25 attached to the top of the case main body 23, and an upper lid 26 mounted on the upper portion of the inner lid 25. In the case main body 23, as shown in FIG. 3, a plurality of cell chambers 23A in which the respective secondary batteries 31 are individually accommodated may be provided side by side in the X direction.

As shown in FIG. 3, the positioning member 24 has a plurality of bus bars 27 arranged on the upper surface. The positioning member 24 is disposed above the plurality of secondary batteries 31 arranged in the case main body 23, and thus the plurality of secondary batteries 31 are positioned and connected in series by the plurality of bus bars 27.

As shown in FIG. 2, the inner lid 25 has a substantially rectangular shape in plan view, and has a shape with a height difference in the Y direction. A pair of terminal portions 22P and 22N to which harness terminals (not shown) are connected are provided at both ends in the X direction of the inner lid 25. The pair of terminal portions 22P and 22N are made of a metal such as a lead alloy, for example, and 22P is a positive electrode terminal portion and 22N is a negative electrode terminal portion.

As shown in FIG. 3, the inner lid 25 has the control board 28 accommodated therein. The inner lid 25 is attached to the case main body 23, and thus the secondary battery 31 and the control board 28, which will be described later, are connected.

The electrical configuration of the battery 20 will be described with reference to FIG. 4. The battery 20 includes an assembled battery 30, a current breaker 37, a current sensor 41, a voltage detection unit 45, temperature sensors 47 and 49, and a battery management device (hereinafter referred to as BM) 50 that manages the assembled battery 30. The BM 50 is an example of the "estimation unit" and the "change unit". The current sensor 41 is an example of the "current measurement unit". The BM 50 and the current sensor 41 are examples of the "estimation device".

The assembled battery 30 includes a plurality of secondary batteries (for example, lithium ion secondary batteries) 31 connected in series. The assembled battery 30, the current sensor 41, and the current breaker 37 are connected in series via an energization path 35. The current sensor 41 is disposed on the negative electrode side and the current breaker 37 is disposed on the positive electrode side, and the current sensor 41 and the current breaker 37 are connected to the negative electrode terminal portion 22N and the positive electrode terminal portion 22P, respectively.

As shown in FIG. 4, the battery 20 is connected with a cell motor 15 for starting an engine (not shown) mounted on the automobile 1, and the cell motor 15 is driven by receiving power from the battery 20. In addition to the cell motor 15, a vehicle load (not shown) such as an electrical component and an alternator 17 are connected to the battery 20. When the power generation amount of the alternator 17 is greater than the power consumption of the vehicle load, the battery 20 is charged by the alternator 17. Further, when the power generation amount of the alternator is smaller than the power consumption of the vehicle load, the battery 20 is discharged to compensate for the shortage.

The current sensor 41 is provided inside the battery case 21 and detects a current flowing through the secondary battery 31. The current sensor 41 is electrically connected to the BM 50 through a signal line, and the power of the current sensor 41 is taken into the BM 50.

The voltage detection unit 45 is provided inside the battery case 21 and detects the voltage of each secondary battery 31 and the total voltage of the assembled battery 30. The voltage detection unit 45 is electrically connected to the BM 50 through a signal line, and the power of the voltage detection unit 45 is taken into the BM 50.

The temperature sensor 47 is provided inside the battery case 21 and detects the temperature of the secondary battery 31. The temperature sensor 47 is electrically connected to the BM 50 through a signal line, and the power of the temperature sensor 47 is taken into the BM 50.

The temperature sensor 49 is provided inside the battery case 21 and detects the temperature of the environmental temperature of the battery 20. The temperature sensor 49 is electrically connected to the BM 50 through a signal line, and the power of the temperature sensor 49 is taken into the BM 50.

The current breaker 37 is provided inside the battery case 21. The current breaker 37 is disposed on the energization path 35 of the assembled battery 30.

The BM 50 includes a CPU 51 having a calculation function, a memory 53 storing various information, a communication unit 55, and the like, and is provided on the control board 28. A vehicle ECU (Electronic Control Unit) 100 mounted on the automobile 1 is connected to the communication unit 55, and the BM 50 receives information about the vehicle such as the engine operating state from the vehicle ECU 100.

The BM 50 monitors the current of the secondary battery 31 based on the power of the current sensor 41. Based on the power of the voltage detection unit 45, the voltage of each secondary battery 31 and the total voltage of the assembled battery 30 are monitored. The BM 50 monitors the temperature of the secondary battery 31 and the environmental temperature of the battery 20 based on the power of the temperature sensor 47, 49.

2. Characteristics of Secondary Battery

The secondary battery 31 is an iron phosphate-based lithium ion secondary battery using lithium iron phosphate (LiFePO$_4$) as a positive active material and graphite as a negative active material.

Figure 5:
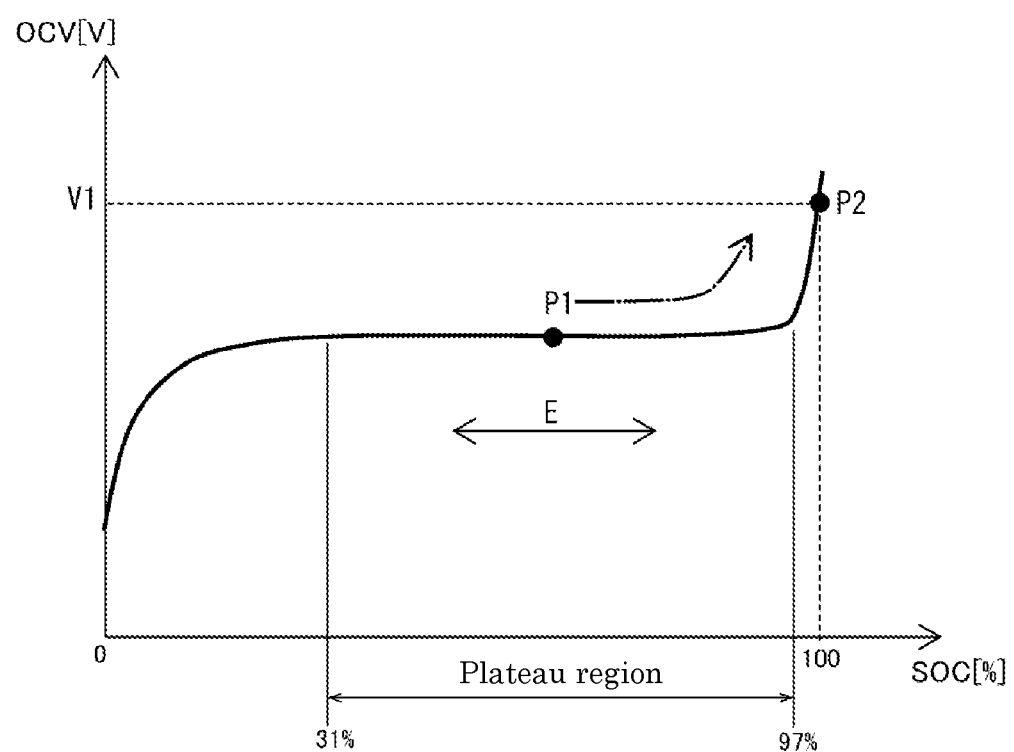
FIG. 5 is a diagram showing SOC-OCV correlation characteristics of a secondary battery.

FIG. 5 shows the SOC-OCV correlation characteristics of the secondary battery 31 with the horizontal axis representing SOC [%] and the vertical axis representing OCV [V]. The SOC (state of charge) is the ratio of the residual capacity Cr to the available capacity Ca of the secondary battery 31 as shown in (1) below. The available capacity Ca is a capacity that can be taken out from the secondary battery 31 in a fully charged state. The full charge capacity of the secondary battery 31 is assumed to be the available capacity Ca.

OCV (open circuit voltage) is an open voltage of the secondary battery 31. The open voltage of the secondary battery 31 can be detected by measuring the voltage of the secondary battery 31 in a state of no current or in a state that can be regarded as no current.

$$SOC=Cr/Ca\times 100 \qquad (1)$$

As shown in FIG. 5, the secondary battery 31 has a plateau region in which the change amount of the OCV with respect to the change amount of the SOC is substantially flat. The plateau region is a region in which the change amount of OCV with respect to the change amount of SOC is 2 [mV/%] or less. The plateau region is generally located in a range in which the SOC is 31% to 97%. The region in which the SOC is 31% or less and the region in which the SOC is 97% or more are high change regions where the change amount of the OCV with respect to the change amount of the SOC is larger than the plateau region.

The main application of the battery 20 is engine start, and it is necessary to cause a cranking current of several hundreds of amperes, sometimes 1000 A or more to flow at the time of engine start. It is also necessary to accept regenerative energy when the vehicle decelerates.

Accordingly, the secondary battery 31 is not controlled in the vicinity of full charge, and is controlled so that the SOC becomes about 70% as a median value in the plateau region. That is, assuming that the lower limit value of the normal use range E of the secondary battery 31 is SOC 60% and the upper limit value thereof is SOC 80%, the BM 50 sends a charge command to the vehicle ECU 100 when the SOC falls below 60%. Thereby, the secondary battery 31 is charged to SOC 80%, that is, the upper limit value. If the SOC of the secondary battery 31 exceeds the upper limit 80%, the BM 50 suppresses power generation by the alternator 17 via the vehicle ECU 100 and supplies power to the vehicle load using the secondary battery 31 to lower the SOC. By repeating such a process, the secondary battery 31 is controlled so that the SOC becomes about 70% as the median value in the plateau region.

3. SOC Estimation Process and Reset Process (Correction Process)

The BM 50 performs a process of estimating the SOC of the secondary battery 31. As shown in the following equation (2), the SOC can be estimated from the initial value of SOC and the cumulative integrated value of current I detected by the current sensor 41 (current integration method).

$$SOC=SOCo+\int Idt/Ca \qquad (2)$$

SOCo is the initial value of SOC at the start of operation, and I is the current.

In the current integration method, measurement errors of the current sensor 41 are accumulated. Therefore, the BM 50 periodically performs charging to full charge, and resets the error in the estimated SOC value as determined by the current integration method.

Figure 6:
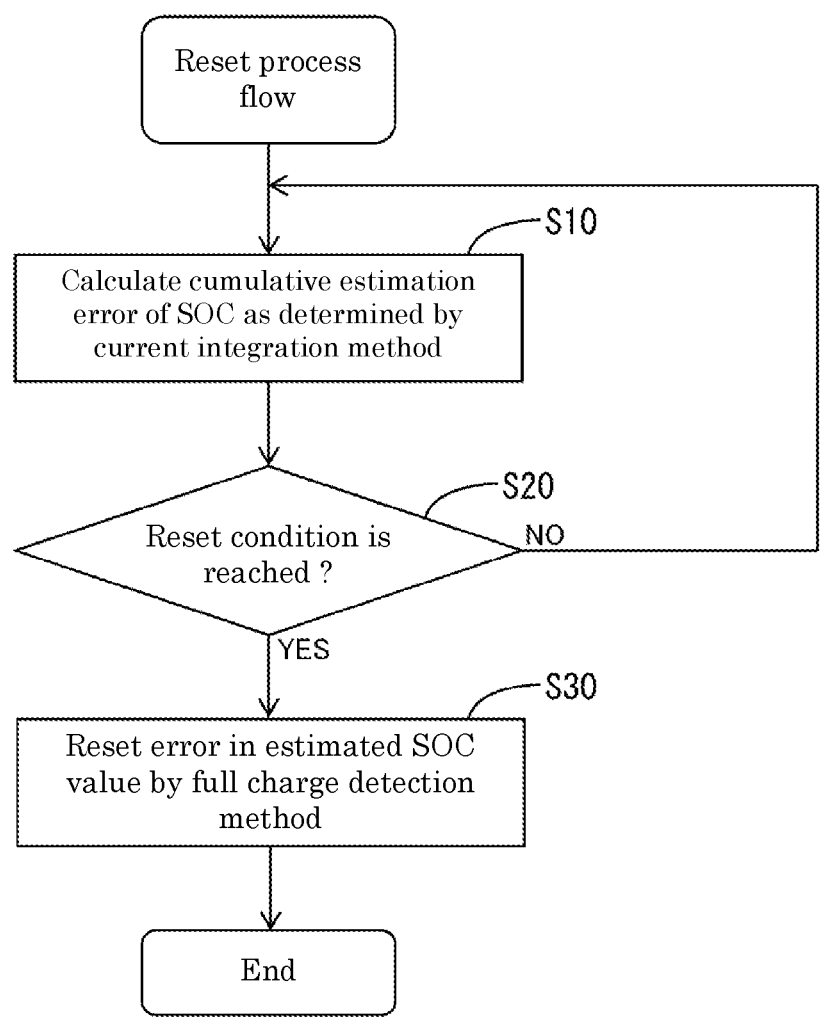
FIG. 6 is a diagram showing a flow of a reset process (correction process).

FIG. 6 is a flowchart of a reset process. The flow of the reset process is composed of three steps S10 to S30. The BM 50 starts the flow of the reset process simultaneously with the start of SOC estimation by the current integration method.

When the flow starts, the BM 50 calculates an SOC cumulative estimation error ε as determined by the current integration method (S10). The SOC cumulative estimation error ε can be calculated from the "measurement error" of the current sensor 41, the "energization time" of the battery 20, the "current value" of the battery 20, and the like.

The measurement error of the current sensor 41 includes an absolute error that does not depend on the current value and a relative error that depends on the current value.

When only the absolute error is used as the measurement error, the SOC cumulative estimation error ε can be calculated from the product of the "energization time" of the battery 20 and the "absolute error".

When the measurement error includes both the absolute error and the relative error, "the value obtained by integrating the relative error according to the current value of the battery 20 with respect to the energization time" and "the value obtained by integrating the absolute error with respect to the energization time" are added. Thereby, the SOC cumulative estimation error ε can be calculated.

Some of the relative error at the time of discharging and charging is to be offset and canceled. The canceled relative error should be taken into consideration.

The BM 50 performs the process of determining whether a reset condition is reached following the process of S10. The reset condition is a condition for determining whether or not to execute the reset process for resetting an error in the estimated SOC value as determined by the current integration method (S20). The reset condition is defined by the SOC cumulative estimation error ε as determined by the current integration method calculated in S10 and the threshold H, and the cumulative estimation error ε≥threshold H holds.

The BM 50 determines that the reset condition has not been reached when the SOC cumulative estimation error ε as determined by the current integration method is smaller than the threshold H (S20: NO). If the reset condition has not been reached, the process returns to S10, and the BM 50 continues to calculate the SOC cumulative estimation error ε.

After the SOC estimation by the current integration method is started, the calculated SOC cumulative estimation error ε gradually increases and eventually exceeds the threshold H.

When the SOC cumulative estimation error ε exceeds the threshold H, the BM 50 determines that the reset condition has been reached (S20: YES).

When the reset condition is reached, the BM 50 executes a reset process (S30) for resetting the error in the estimated SOC value as determined by the current integration method by the full charge detection method. The full charge detection method is a method in which the secondary battery 31 is charged to full charge, and the SOC of the secondary battery 31 when full charge is detected is estimated as "100%".

More specifically, when the reset condition is reached, the BM 50 sends a charge command to the alternator 17 via the vehicle ECU 100 to charge the secondary battery 31 to full charge (S30: charge control). As a result, according to the SOC-OCV correlation characteristics shown in FIG. 5, the SOC moves from P1 included in the normal use range E to P2 corresponding to full charge.

The full charge will be described. The alternator 17 charges the secondary battery 31 by a CCCV (constant current/constant voltage) method. CCCV charging is a charge method that combines constant current charge (CC charge) and constant voltage charge (CV charge). After charging starts, charging is performed at a constant current until the total voltage of the assembled battery 30 reaches a predetermined voltage (constant current charge).

After the assembled battery 30 reaches a predetermined voltage, the charge current is controlled so that the total voltage of the assembled battery 30 does not exceed the set voltage (upper limit voltage) (constant voltage charge). As a result, the charge current droops (see FIG. 7). When the drooping charge current falls below a predetermined current threshold (for example, 0.05 C in terms of the current rate of the battery 20), it is determined that the battery is fully charged and charging is stopped. That is, during constant voltage charge, full charge is determined on condition that the drooping charge current falls below the current threshold.

When the full charge of the secondary battery 31 is detected, the BM 50 estimates the SOC of the secondary battery 31 when the full charge is detected as 100%. Thereby, the error in the estimated SOC value as determined by the current integration method, that is, the cumulative estimation error ε can be reset.

At full charge, the change amount of the OCV with respect to the change amount of the SOC is large. Therefore, the full charge detection method has high SOC estimation accuracy, and the error in the estimated SOC value as determined by the current integration method can be accurately reset.

After the reset, the SOC is estimated by the current integration method using the SOC obtained by the full charge detection method as an initial value.

In the above, a case where full charge is detected is described as an example of the full charge detection method. However, it may be detected that the vicinity of the full charge is reached, and the SOC of the secondary battery 31 at that time may be estimated as the vicinity of 100%, for example, 97% or 98%. The vicinity of full charge is a range where detection accuracy equivalent to the case of full charge can be obtained when SOC is estimated by the OCV method described later, and the difference in SOC value with respect to full charge (SOC=100) is in the range of several percentages.

4. Battery Status and Change of Reset Condition

Since the alternator 17 needs to be driven to charge the secondary battery 31 to full charge or the vicinity thereof, the fuel consumption of the vehicle is reduced. Therefore, it is preferable that the number of times that the secondary battery 31 is charged to full charge or the vicinity thereof is as small as possible for executing the reset process.

The state of the battery 20 includes a case where the required level of SOC estimation accuracy is low or a case where it is high. When the required level of SOC estimation accuracy is low, it is possible to improve the fuel consumption of the vehicle by reducing the frequency of the reset process.

From the above, the BM 50 changes the reset condition according to the state of the battery 20. Specifically, the required level of SOC estimation accuracy is divided into three levels: low, medium, and high. Then, the threshold H for the cumulative estimation error ε is set to "H1" when the level is low, "H2" when the level is medium, and "H3" when the level is high. The magnitude relationship among H1, H2, and H3 is shown by the following equation (3).

$$H3<H2<H1 \quad (3)$$

In this way, the execution frequency of the charge control performed for a reset process changes according to the required level of SOC estimation accuracy. Specifically, the lower the required level of SOC estimation accuracy, the lower the execution frequency. Therefore, it is possible to improve the fuel consumption of the vehicle while maintaining the required SOC estimation accuracy. The fuel consumption of the vehicle is improved as compared with the case where the execution frequency of the charge control is uniformly increased for high estimation accuracy.

As a case where the required level of SOC estimation accuracy varies, a case where the environmental temperature of the secondary battery 31 varies can be exemplified.

When the temperature is low such as in winter, the secondary battery 31 has high internal resistance and low power. When the power is low, the battery 20 cannot pass a cranking current unless the residual capacity Cr is large to some extent. Since a large SOC estimation error may affect the engine startability, the required level of SOC estimation accuracy is high.

On the other hand, when the temperature is high such as in summer, the secondary battery 31 has a low internal resistance and a high power. When the power is high, the battery 20 can pass the cranking current even if the residual capacity Cr is smaller than when the temperature is low. Even if the SOC estimation error is large to some extent, it rarely affects the engine startability, so that the required level of SOC estimation accuracy can be set lower than in winter.

The BM 50 acquires the environmental temperature of the battery 20 based on the power of the temperature sensor 49, and changes the threshold H for the cumulative estimation error ε according to the environmental temperature. That is, when the environmental temperature is low (such as winter), the threshold H1 is selected, when the environmental temperature is medium (such as spring or autumn), the threshold H2 is selected, and when the environmental temperature is high (such as summer), the threshold H3 is selected.

When the environmental temperature is low, the charge control and reset process are frequently executed, so the SOC estimation accuracy is high. Therefore, it is possible to prevent the residual capacity Cr of the battery 20 from falling below the capacity necessary for cranking due to the error in estimation accuracy, and thus it is possible to ensure the engine startability.

On the other hand, when the environmental temperature is high, the execution frequency of the charge control and the reset process is reduced. Since the number of times the alternator 17 is driven can be reduced, the fuel consumption of the vehicle can be improved.

5. Description of Effect

According to the BM 50, the execution frequency of the reset process and the charge control can be set to a frequency suitable for the state of the secondary battery 31.

Embodiment 2

In Embodiment 1, the case where the environmental temperature of the secondary battery 31 varies is exemplified as the case where the required level of SOC estimation accuracy varies.

In Embodiment 2, a case where the capacity retention ratio Z of the secondary battery 31 varies is exemplified as a case where the required level of SOC estimation accuracy varies. The capacity retention ratio Z is a retention ratio of the available capacity Ca and can be obtained by the following equation (4).

$$Z = Ca\_t / Ca\_o \times 100 \quad (4)$$

Ca_o is the initial value of the available capacity Ca (at the start of use), and Ca_t is the available capacity Ca at the elapsed time T from the start of use.

When the capacity retention ratio Z of the secondary battery 31 is low, the internal resistance is large, and when the capacity retention ratio Z is high, the internal resistance is small.

Therefore, when the capacity retention ratio Z is low (when deterioration is large), the power of the secondary battery 31 is low as in winter. When the power is low, the battery 20 cannot pass the cranking current unless the residual capacity Cr is large to some extent. If the SOC estimation error is large, the engine startability may be affected, so that the required level of SOC estimation accuracy is high.

When the capacity retention ratio Z is high (when it is not deteriorated), the power of the secondary battery 31 is high as in summer, so that the battery 20 can pass the cranking current even if the residual capacity Cr is small compared to when it is deteriorated. Even if the SOC estimation error is large to some extent, it rarely affects the engine startability, so that the required level of SOC estimation accuracy can be set lower than when the capacity retention ratio Z is high.

The BM 50 estimates the capacity retention ratio Z of the battery 20 from information on the number of years since it was mounted on the vehicle and the history of the environmental temperature. The BM 50 changes the threshold H for the cumulative estimation error ε according to the estimated capacity retention ratio Z. That is, when the capacity retention ratio Z is low, the threshold H1 is selected, when the capacity retention ratio Z is medium, the threshold H2 is selected, and when the capacity retention ratio Z is high, the threshold H3 is selected.

The lower the capacity retention ratio Z (the greater the deterioration), the more frequently the charge control and reset process are executed, so that the SOC estimation accuracy is higher. Therefore, it is possible to prevent the residual capacity C of the battery 20 from falling below the capacity necessary for cranking due to an error in estimation accuracy, and thus it is possible to ensure the engine startability.

On the other hand, when the capacity retention ratio Z is high (when it is not deteriorated), the execution frequency of the charge control and the reset process is reduced. Since the number of times the alternator 17 is driven can be reduced, the fuel consumption of the vehicle can be improved.

Embodiment 3

In Embodiment 1, the reset condition is changed according to the state of the battery. In Embodiment 3, the charge condition is changed according to the state of the battery 20.

Figure 7:
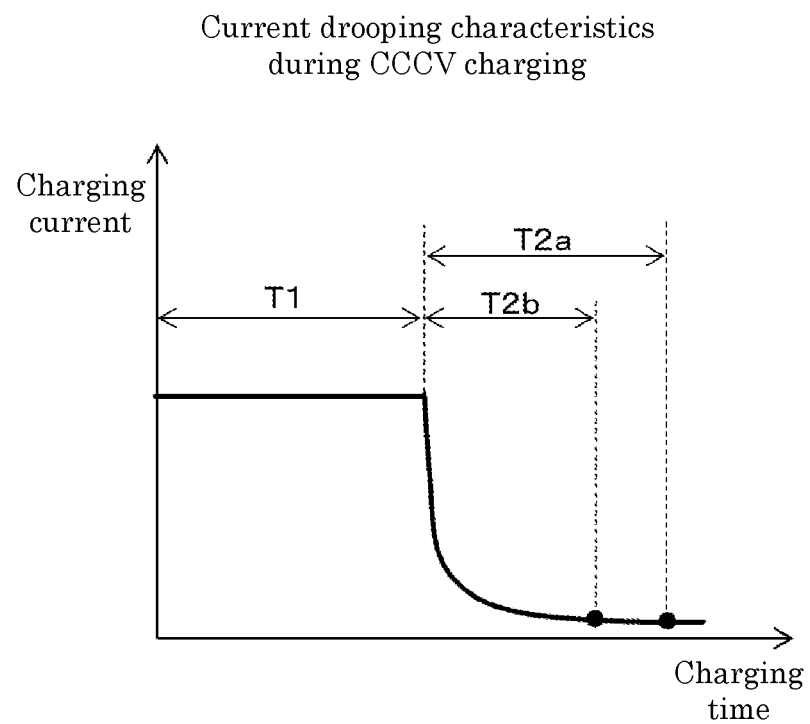
FIG. 7 is a graph showing current drooping characteristics during CCCV charging in Embodiment 3.

FIG. 7 shows the drooping characteristics of the charge current during CCCV charging. CCCV charging is a charge method that combines constant current charge (CC charge) and constant voltage charge (CV charge). After charging starts, charging is performed at a constant current for a period T1 until the total voltage of the assembled battery 30 reaches a predetermined voltage (constant current charge). When the total voltage 30 of the assembled battery 30 reaches a predetermined voltage, the charge current is then controlled so that the total voltage of the assembled battery 30 does not exceed the set voltage (constant voltage charge). As a result, the charge current droops as shown in FIG. 7. In Embodiment 3, charging time T2 after switching to constant voltage charge is set as a charging termination condition, and charging ends when charging time T2 reaches a predetermined time.

When the alternator 17 mounted on the vehicle receives a charge command from the BM 50 via the vehicle ECU 100, the alternator 17 performs the CCCV charge to charge the secondary battery 31.

At charging for the reset process (S30 in FIG. 6), the BM 50 changes the charging time T2 according to the state of the battery 20. Specifically, when the required level of SOC estimation accuracy is high, such as when the environmental temperature is low, the charging time T2 is set to "T2a". When the required level of SOC estimation accuracy is low, such as when the environmental temperature is high, the charging time T2 is set to "T2b", which is shorter than "T2a".

$$T2b < T2a \quad (5)$$

"T2a" is set to a time during which the secondary battery 31 is charged to full charge. "T2b" is set to a time during which the secondary battery 31 is charged to the vicinity of full charge, for example, 98% of full charge.

From the above, when the required level of SOC estimation accuracy is high, such as when the environmental temperature is low, the secondary battery 31 is charged to full charge by the reset process, and the SOC of the secondary battery 31 at the end of charging is estimated to be 100%. On the other hand, when the required level of SOC estimation accuracy is low, such as when the environmental temperature is high, the secondary battery 31 is charged to the vicinity of full charge by the reset process, and the SOC of the secondary battery 31 at the end of charging is estimated to be 98%.

The OCV changes more as the SOC value is higher in the region where the SOC is 97% or more. Therefore, when the required level of SOC estimation accuracy is high, the SOC estimation accuracy is increased by increasing the charging time T2 and charging to full charge.

When the required level of SOC estimation accuracy is low, the battery is less charged by shortening the charging time T2. Accordingly, although the SOC estimation accuracy is slightly lowered, the shortened charging time can shortens the alternator driving time and improve the fuel consumption of the vehicle.

Embodiment 4

In Embodiment 4, when the reset condition is nearly satisfied, a process of shifting the normal use range E of the secondary battery 31 to the high SOC side is executed. The high SOC side is a region where the SOC is higher (the region on the right side in FIG. 9).

Figure 8:
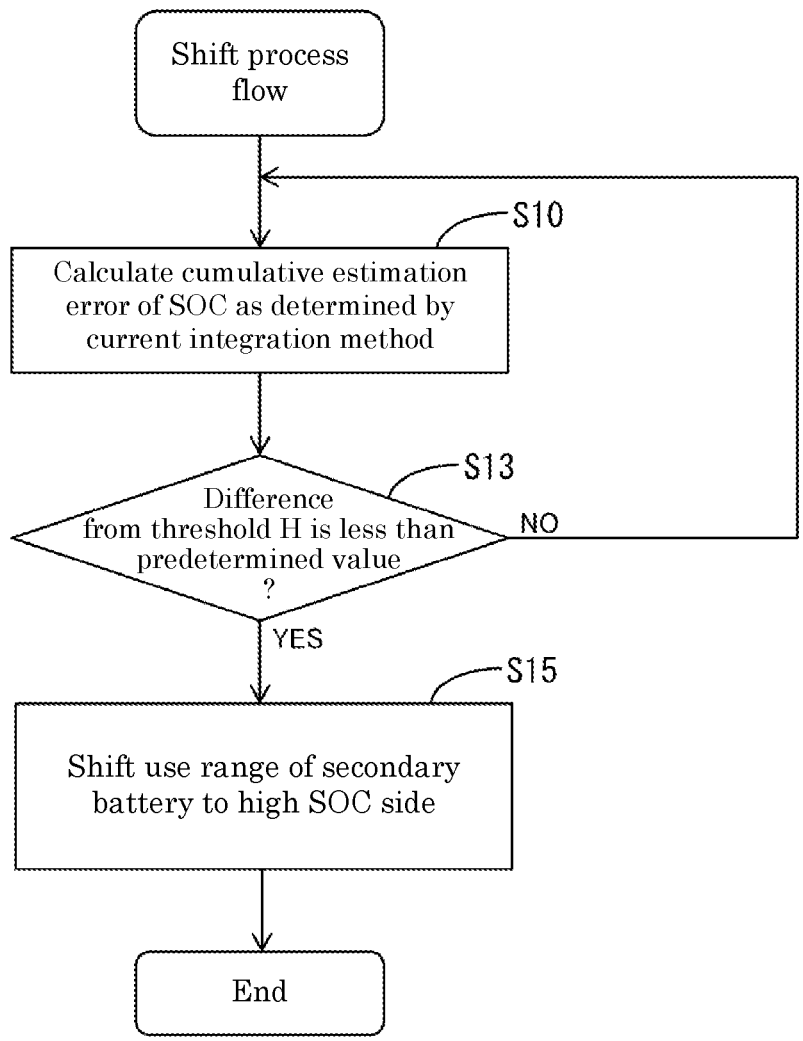
FIG. 8 is a diagram showing a flow of a reset process (correction process) in Embodiment 4.

Hereinafter, the flow of the shift process will be described with reference to FIG. 8. The shift process flow is composed of three steps S10 to S15.

The BM 50 starts the shift process flow simultaneously with the start of SOC estimation by the current integration method. The shift process flow is performed in parallel with the reset process flow shown in FIG. 6.

When the shift process flow starts, the BM 50 first calculates the SOC cumulative estimation error ε as determined by the current integration method (S10). This process is the same as S10 in FIG. 6.

After calculating the SOC cumulative estimation error ε, the BM 50 determines whether the difference between the cumulative estimation error ε and the threshold H for the reset condition is less than a predetermined value (S13). The cumulative estimation error ε is an example of "condition value".

When the difference between the cumulative estimation error ε and the threshold H is less than the predetermined value (S13: NO), the process returns to S10, and the BM 50 continues to calculate the SOC cumulative estimation error ε.

After the SOC estimation process by the current integration method is started, the SOC cumulative estimation error ε gradually increases, and the difference from the threshold H is eventually less than a predetermined value.

When the difference between the SOC cumulative estimation error ε and the threshold H is less than the predetermined value (S13: YES), the BM 50 performs a shift to shift the normal use range E of the secondary battery 31 to the high SOC side (S15).

Figure 9:
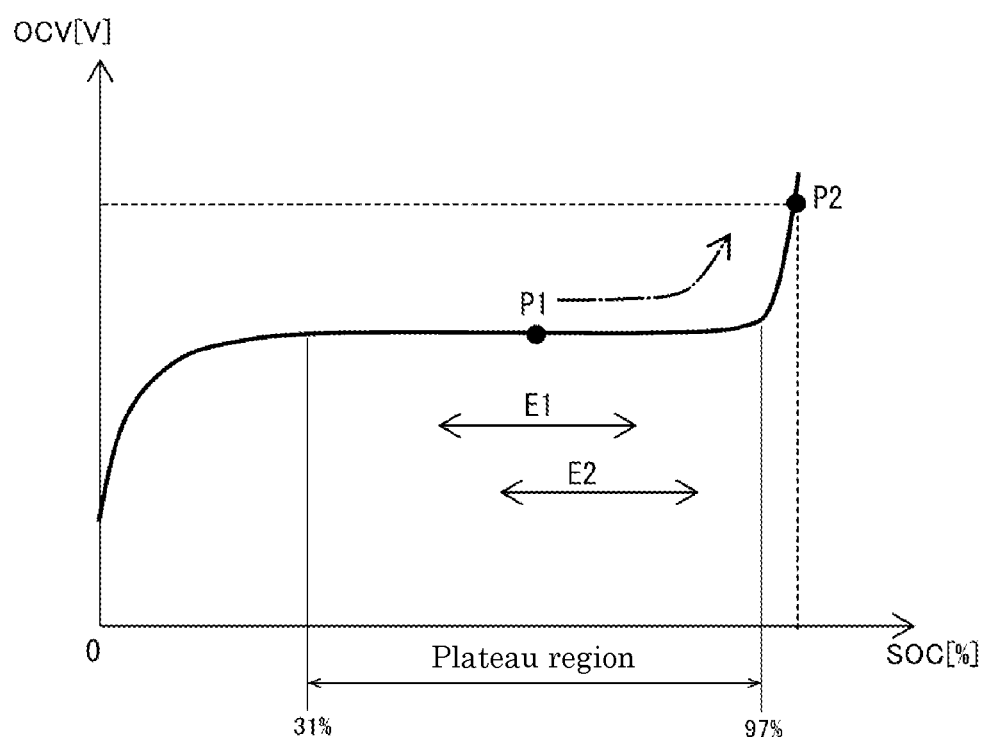
FIG. 9 is a diagram showing shift of a normal use range.

Specifically, the lower limit value of the normal use range E of the SOC is changed to 70% and the upper limit value is changed to 90%, and the BM 50 sends a charge command to the vehicle ECU 100 when the SOC falls below 70%. Thereby, the secondary battery 31 is charged to SOC 90%, that is, the upper limit value. In addition, when the SOC of the secondary battery 31 exceeds the upper limit value 90%, the BM 50 suppresses power generation of the alternator 17 via the vehicle ECU 100 and supplies power to the vehicle load from the secondary battery 31 to lower the SOC. By repeating such a process, the secondary battery 31 is controlled so that the SOC is approximately 80% as the median value within the plateau region. In FIG. 9, E1 represents the normal use range before the shift, and E2 represents the normal use range E2 after the shift.

The BM (an example of the "execution unit" of the present invention) 50, when the difference between the SOC cumulative estimation error ε and the threshold H is less than a predetermined value, the normal use range E of the secondary battery 31 is shifted to the high SOC side. Therefore, since the SOC value before the start of charging becomes high, it is possible to shorten the time (charging time) for charging the battery 20 to full charge for the reset process (S30 in FIG. 6).

Other Embodiments

The present invention is not limited to the embodiments described above with reference to the drawings. For example, the following embodiments are also included in the technical scope of the present invention.

(1) In Embodiment 1, the example of mounting the battery 20 on the vehicle is shown, but the battery 20 may be mounted on a hybrid construction machine or a hybrid train. Further, the battery 20 can be applied to other applications. The battery 20 is preferably applied to an application in which the secondary battery 31 is used in the plateau region and "the frequency of charging to full charge or the vicinity thereof is low.

(2) In Embodiment 1, the lithium ion secondary battery 31 is exemplified as the energy storage device. The energy storage device is not limited to the lithium ion secondary battery, and may be another secondary battery or a capacitor. As the characteristics of the energy storage device, it is preferable that the SOC-OCV characteristics have a plateau region or a low change region, and the change in OCV is large in the vicinity of full charge. The low change region is a region in which the change amount of the OCV with respect to the change amount of the SOC is relatively small as compared with the vicinity of the full charge.

(3) In Embodiment 1, the condition related to "SOC cumulative estimation error ε" is set as the reset condition. In addition to this, a condition related to "the energization time of the battery 20" or a condition related to "an elapsed time since the previous reset process" may be set as the reset condition.

(4) In Embodiment 1, when the drooping charge current falls below a predetermined current threshold, it is determined that the battery is fully charged. In addition to the method based on the value of the drooping charge current, the method for determining full charge can also be determined based on the charging time after switching from constant current charge to constant voltage charge and the total voltage of the assembled battery 30.

(5) In Embodiment 1, an example of correcting (resetting) the error in the estimated SOC value as determined by the current integration method using the full charge detection method has been described. The correction method is not limited to the full charge detection method, and the error in estimated SOC value as determined by the current integration method may be corrected by charging the battery 20 to full charge or the vicinity thereof, and then estimating the SOC by the OCV method.

In the OCV method, the SOC is estimated based on the OCV of the secondary battery 31, and the SOC is estimated by referring the measurement value of OCV to the correlation data (FIG. 5) showing the correlation between the SOC and the OCV.

(6) In Embodiment 4, the example of changing the charging time T2 during constant voltage charge according to the state of the battery 20 has been described. In addition to this, other charge conditions such as a charge end voltage may be changed. Further, the process for changing the charge condition may be performed without the execution of the process for changing the correction condition or the process for changing the charging time T2, and may be performed independently. In other words, only the process of changing the charge condition may be performed without executing the process of changing the correction condition.

(7) In an application where the energy storage apparatus is float-charged like uninterruptible power systems (UPS), SOC 100% may be set in the plateau region or the low change region. Even in that case, the SOC estimation accuracy can be improved by applying the concept of the present invention when refresh charging is performed on the energy storage apparatus (when charging exceeds SOC 100%). The concept of the present invention can also be applied to energy storage apparatuses for industrial use.

(8) In Embodiment 1, the SOC cumulative estimation error ε is calculated based on the "measurement error" of the current sensor 41. The measurement error of the current sensor 41 may vary depending on the environmental temperature and the age of use. Therefore, the measurement error of the current sensor 41 may be changed based on at least one of the environmental temperature and the age of use. Specifically, the relationship between the environmental temperature and the age of use and the measurement error of the current sensor may be obtained in advance through experiments or the like, and the measurement error of the current sensor 41 may be changed based on the data.

DESCRIPTION OF REFERENCE SIGNS

1: Automobile (an example of "vehicle")
15: Cell motor
17: Alternator
20: Battery
30: Assembled battery
31: Secondary battery (an example of "energy storage device")
41: Current sensor (an example of "current measurement unit")
45: Voltage detection unit
50: BM (an example of "estimation unit", "change unit", "execution unit")

The invention claimed is:

1. An estimation device for estimating an SOC of an energy storage device, the estimation device comprising:
a current measurement unit;
an estimation unit; and
a change unit,
wherein
the estimation unit executes:
an estimation process for estimating the SOC of the energy storage device by integrating a current measured by the current measurement unit, and
a correction process for charging, when a predetermined correction condition is reached, the energy storage device to full charge or a vicinity thereof, and correcting an error in the estimated SOC value, and
the change unit changes the correction condition according to a state of the energy storage device, wherein
a difference in the state of the energy storage device comprises a difference in required SOC estimation accuracy, and
a required level of the SOC estimation accuracy differs depending on an environmental temperature or a capacity retention ratio of the energy storage device.

2. The estimation device according to claim 1, wherein the change unit changes a charge condition for charging the energy storage device in the correction process according to a state of the energy storage device.

3. The estimation device according to claim 1, further comprising an execution unit that executes a process of shifting a use range of an energy storage device to a high SOC side when a difference between a condition value defined as the correction condition and a threshold is less than a predetermined value.

4. The estimation device according to claim 1, wherein the change unit changes a charging time for charging the energy storage device in the correction process according to a state of the energy storage device.

5. An energy storage apparatus for a vehicle mounted on the vehicle, the energy storage apparatus comprising:
an energy storage device; and
an estimation device according to claim 1.

6. An energy storage apparatus, comprising:
an energy storage device;
a current measurement unit;
an estimation unit; and
a change unit,
wherein
the estimation unit executes:
an estimation process for estimating an SOC of the energy storage device by integrating a current measured by the current measurement unit, and
a correction process for charging, when a predetermined correction condition is reached, the energy storage device to full charge or a vicinity thereof, and correcting an error in the estimated SOC value, and
the change unit changes the correction condition according to a state of the energy storage device, wherein
a difference in the state of the energy storage device comprises a difference in required SOC estimation accuracy; and
a required level of the SOC estimation accuracy differs depending on an environmental temperature or a capacity retention ratio of the energy storage device.

7. An estimation method for estimating an SOC of an energy storage device, comprising:
estimating the SOC of the energy storage device by integrating a current;
charging, when a predetermined correction condition is reached, the energy storage device to full charge or a vicinity thereof;
correcting an error in the estimated SOC value; and
changing the correction condition according to a state of the energy storage device, wherein a difference in the state of the energy storage device comprises a difference in required SOC estimation accuracy, and a required level of the SOC estimation accuracy differs depending on an environmental temperature or a capacity retention ratio of the energy storage device.

* * * * *